(12) United States Patent
Schwarzbauer et al.

(10) Patent No.: US 6,559,532 B1
(45) Date of Patent: May 6, 2003

(54) MATRIX CONVERTER

(75) Inventors: Herbert Schwarzbauer, München (DE); Walter Springmann, Adelsdorf (DE); Eckhard Wolfgang, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/622,354

(22) PCT Filed: Dec. 21, 1999

(86) PCT No.: PCT/DE99/04057

§ 371 (c)(1),
(2), (4) Date: Aug. 15, 2000

(87) PCT Pub. No.: WO00/38306

PCT Pub. Date: Jun. 29, 2000

(30) Foreign Application Priority Data

Dec. 21, 1998 (DE) .......................... 198 59 127

(51) Int. Cl.⁷ .............................. H01L 23/52
(52) U.S. Cl. .................. 257/691; 257/723; 361/761
(58) Field of Search ................... 363/15, 16, 27, 363/34, 35, 37, 38, 51, 124, 65, 67, 68, 69, 70, 71, 73, 77, 108, 109, 142, 138, 127, 128; 257/119, 120

(56) References Cited

U.S. PATENT DOCUMENTS 4,253,054 A * 2/1981 Steigerwald ................. 320/14
5,608,237 A 3/1997 Aizawa et al.
5,793,064 A 8/1998 Li

FOREIGN PATENT DOCUMENTS

| DE | 198 04 192 A1 | 8/1999 |
| EP | 0 681 330 A2 | 11/1995 |
| EP | 0 833 431 A2 | 4/1998 |
| JP | 06202705 A * | 7/1994 |

OTHER PUBLICATIONS

Ogura, et al., High Frequency 6000 V Double Gate GTOs With Buried Gate Structure; Proceedings of the 1990 International Symposium on Power Semiconductor Devices & IC's, Tokyo; pp. 252–255.

* cited by examiner

*Primary Examiner*—Wael Fahmy
*Assistant Examiner*—Dana Farahani
(74) *Attorney, Agent, or Firm*—Young & Thompson

(57) ABSTRACT

Nine bidirectionally blocking power components are attached on a substrate in the form of a three-row matrix. The power components are attached between three respective current conductors arranged parallel to each other above and below the power components. The current conductors above the matrix proceed at a right angle relative to the current conductors under the matrix. The interconnects to the gate and auxiliary emitter terminals are situated on or in a thin insulating printed circuit board or film and are secured to the corresponding contacts of the chips in recesses of the current conductors.

8 Claims, 6 Drawing Sheets

MATRIX CONVERTER

BACKGROUND OF THE INVENTION

1. Field of the Invention

The present invention is directed to an arrangement of power semiconductor components in a suitable mounting device as matrix converter.

2. Description of the Prior Art

European Application 0 8333 431 discloses a three-phase matrix current converter, whereby nine main switches combined in three switch groups as well as a respective auxiliary commutation means with an auxiliary switch fashioned as four-segment switch are present between the switch groups. IGBTS each having inverse diode, two blockable GTO thyristors connected parallel or two series-connected parallel circuits of an asymmetrical GTO with an inverse diode are recited as switches. With this device, it is possible to convert a.c. voltages of a given amplitude and frequency into a.c. voltages of an arbitrary amplitude and frequency. Such matrix converters will achieve great significance in future since, given little reactance onto the power network, they open up the possibility—given generating operation of a motor driven therewith—of re-supplying the energy that the motor delivers into the power network. Previous arrangements of power switches that are suitable for such matrix converters are so complex that a compact integration is not possible.

The publication by T. Ogura et al., "High frequency 6000 V double gate GTOs with buried gate structure" in Proceedings of 1990 International Symposium on Power Semiconductor Devices & ICs, pages 252–255, describes a component structure wherein semiconductor rides with doped regions and contactings are fashioned on two opposite top sides of a substrate for forming a GTO thyristor. U.S. Pat. No. 5,608,237 discloses a bidirectional semiconductor switch, whereby ICBT structures are formed at two opposite top sides of a substrate of semiconductor material. As a result of the additional control electrode, such a bidirectional IGBT enables the control of the emitter frequency, and a component having very good switching and pass properties can be realized in this way. German OS 198 01 192 discloses a method for the manufacture of bidirectional power semiconductor switches by wafer bonding.

In contrast to the components described therein, conventional IGBTs have three terminals: collector, emitter and gate. In IGBT modules—the most frequently employed format—, the collector is soldered onto a ceramic substrate, and emitter and gate are contacted via bond connections. There are also IGBTs and power diodes in wafer cells. Emitter and collector therein are connected via a pressure contact; the gate connection can ensue via a spring contact. Bidirectional components that have terminal contacts at two principal sides lying opposite one another require a new formatting technique that deviates therefrom. The housing or mounting devices for such components must be designed such that the various terminals can be contacted electrically insulated from one another.

SUMMARY OF THE INVENTION

An object of the present invention is to specify a matrix converter for high current intensities and voltages that can be manufactured in a compact way.

This object is achieved in accordance with the principles of the present invention in a matrix converter constructed of nine bidirectional power semiconductor switches that have respectively at least one terminal contact for the current flow—referred to below as emitter terminal—at principal sides that lie opposite one another. Further, a contact for controlling the switch function—referred to below as gate contact—is located on each principal side. Such a power semiconductor switch can, for example, be a bidirectional IGBT, whereby an IGBT structure with a channel controlled with a gate electrode is present at each of the two principal sides lying opposite one another. By applying suitable potentials to the gate contacts of the gate electrodes, the bidirectional IGBT can be switched to transmit or block in both directions of the current. In order to have a reference potential for the voltage applied for the switching, the respective potential adjacent at the emitter terminals is tapped and conducted to the drive circuit provided for the circuit of the component. This is necessary since high fluctuations of the a.c. voltages to be commutated occur under certain circumstances on the power lines to be switched.

Nine bidirectionally blocking power semiconductor components are arranged in the form of a three-row matrix, so that the one principal sides are at least approximately arranged in one plane, and the other principal sides are correspondingly at least approximately arranged in a co-planar plane spaced therefrom, so that nine principal sides are present on each side of the matrix-like arrangement, i.e. lie in respectively one of two mutually opposite directions of view in a plan view onto the arrangement. Respectively three current conductors arranged next to one another, preferably parallel to one another, are present at both sides of the arrangement. The current conductors at the one side of the matrix-like arrangement proceed at an angle, preferably at a right angle, relative to the current conductors at the other side of the arrangement. Expressed in other words, this means that three current conductors aligned next to one another proceed in longitudinal direction over the component matrix and three current conductors aligned next to one another proceed in transverse direction under the component matrix. The power semiconductor components are arranged adjacent to a respective current conductor, preferably over it or, form, under it, and can form a single chip.

As a result of bidirectional closing of one of the switches, one of the three current conductors proceeding in longitudinal direction is connected to one of the three current conductors proceeding in transverse direction. Three inputs can therefor be selectively connected to three outputs with this arrangement. The respectively three current conductors functioning as inputs or outputs are preferably formed by metallic busbars. Contacts of the power semiconductor components fashioned raised on these busbars can be durably electrically conductively attached by soldering, gluing or with a pressing mechanism.

It is especially expedient to fashion the various lines to the gate and auxiliary emitter terminals as interconnects on or in a thin, insulating printed circuit board or film. The corresponding contact surfaces of the power semiconductor components are secured to contact surfaces provided therefor. The power semiconductor components can be additionally secured to other surface portions of the printed circuit board or film, so that the matrix-like arrangement of the nine power semiconductor elements can thereby be already largely fixed. Such a printed circuit board or film can be present at both sides of the arrangement of the power semiconductor components or at only one of the two respective principal sides. When the lower busbars are secured on a substrate, the leads to the gate terminals and the auxiliary emitter terminals can be arranged within the substrate. The upper terminals can then be formed by leads in a printed circuit board or film that is attached on the upper side of the matrix-like arrangement. The upper busbars that proceed transversely relative to the lower busbars are preferably attached to an upper part that presses from above onto the chips with the power semiconductor components. Alternatively, a film carrying interconnects can be present between the lower busbars applied on a substrate and the matrix-like arrangement. In this case, the terminals of the power semiconductor components can be connected to suitably arranged interconnects in a notoriously known way, for example with bond wires, said interconnects being secured, for example, to an upper part that carries the upper busbars.

DESCRIPTION OF THE PREFERRED EMBODIMENT

Figure 1:
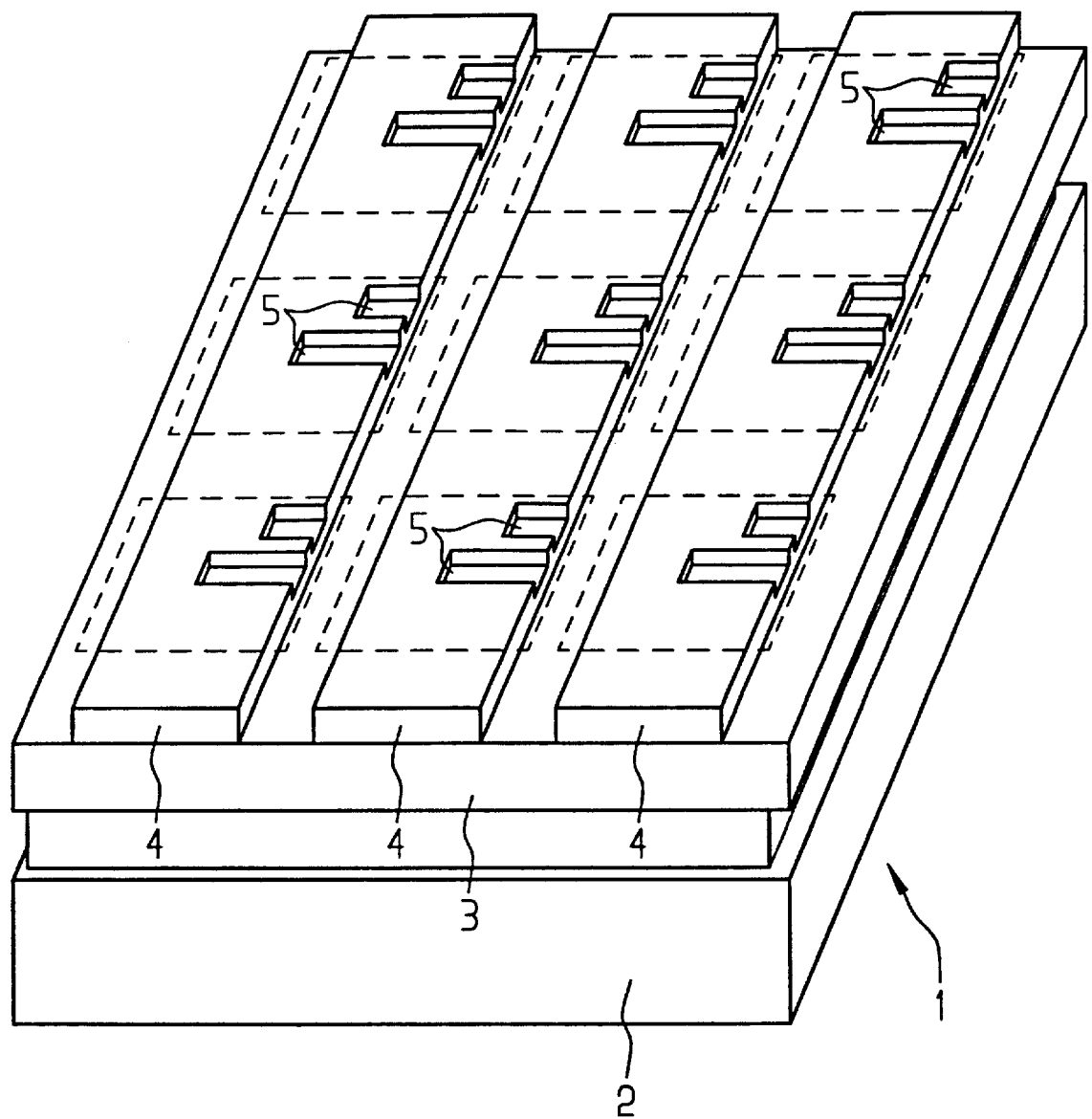
FIG. 1 is a perspective view of a lower part of a matrix converter constructed in accordance with the principles of the present invention.

FIG. 1 schematically shows an example of a lower part 1 of the matrix converter. For mechanical stability, a base plate 2 is preferably present, this being preferably composed of a material that has a coefficient of thermal expansion similar to that of the material of the actual substrate 3. For example, the base plate can be an MMC material (metal matrix composite), for example AlSiC, CuC or CuSic. The substrate 3, which carries the power leads from the network, is preferably AlN. In the example of FIG. 1, the power leads are formed by metallic busbars 4 of, for example, copper. The three required busbars are preferably aligned parallel to one another, as shown. For the purpose of the contacting of the gate terminals and the auxiliary emitter terminals, recesses that, however, can also be omitted are present in the busbars for the chips arranged at the locations bounded with broken lines.

The emitter terminals of the chips provided for the flow of current through the closed switches can be applied directly on the busbars in this exemplary embodiment. The illustration of FIG. 1 shows the critical components without taking the specific dimensions in the respective application into consideration. The busbars can be narrower, the interspaces between them can be broader, so that the chips functioning as switches can also be arranged laterally next to the busbars. A contacting of the emitter terminals then ensues, for example, via lead wires or interconnects that can be present on a separate printer circuit board or on a film provided with interconnects. The exemplary embodiment shown in FIG. 1 has the advantage of simple assembly.

A particular advantage of the arrangement of the chips in a 3×3 matrix is comprised therein that the function of the matrix converter is already realized with the alignment of the upper busbars transversely relative to the alignment of the lower busbars.

Figure 2:
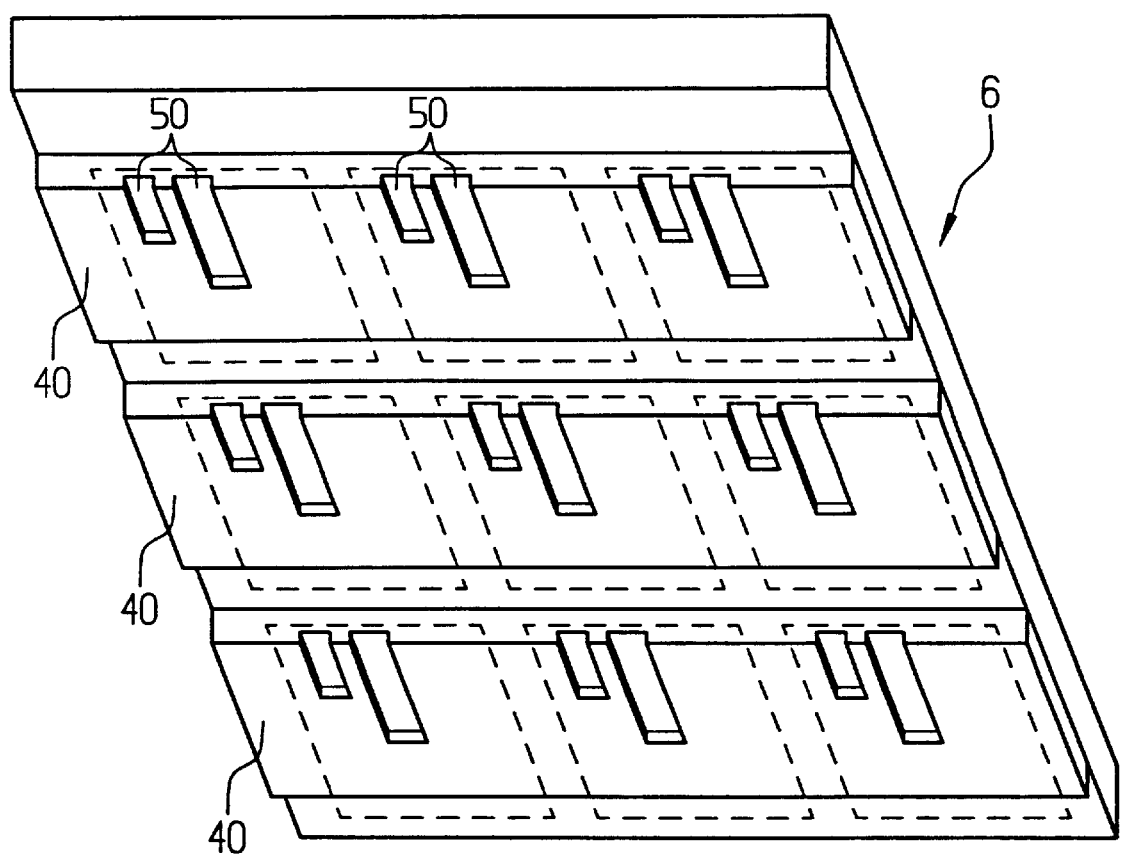
FIG. 2 is a perspective view of an upper part of a matrix converter constructed in accordance with the principles of the present invention.

FIG. 2 shows a suitable upper part 6 of the matrix converter that is constructed analogous to the lower part of FIG. 1. This upper part is placed from above onto the chips arranged on the lower part, such that, in conformity with the alignment shown in FIG. 2, the power leads at the upper part proceed transversely relative to the direction of the power leads on the lower part. Three metallic busbars 40 are likewise present as power leads in this example. The preferred arrangement of the chips is again marked in FIG. 2 by the boundaries entered with broken lines. In this example, recesses 50 for the gate and auxiliary emitter terminals are also shown in the busbars at the upper part.

In the exemplary embodiment shown in FIGS. 1 and 2, the gate contacts are located both on the upper side as well as on the underside of the chips, respectively in the middle of the chip. Instead, the gate terminals can be present at the edge or at a corner of the chip. Since the auxiliary emitter terminals only serve the purpose of transmitting the electrical potential adjacent at the emitter contacts to the drive circuit as reference potential, the auxiliary emitter terminals can also be attached, for example, next to the chips at the edges of the busbars.

Figure 3:
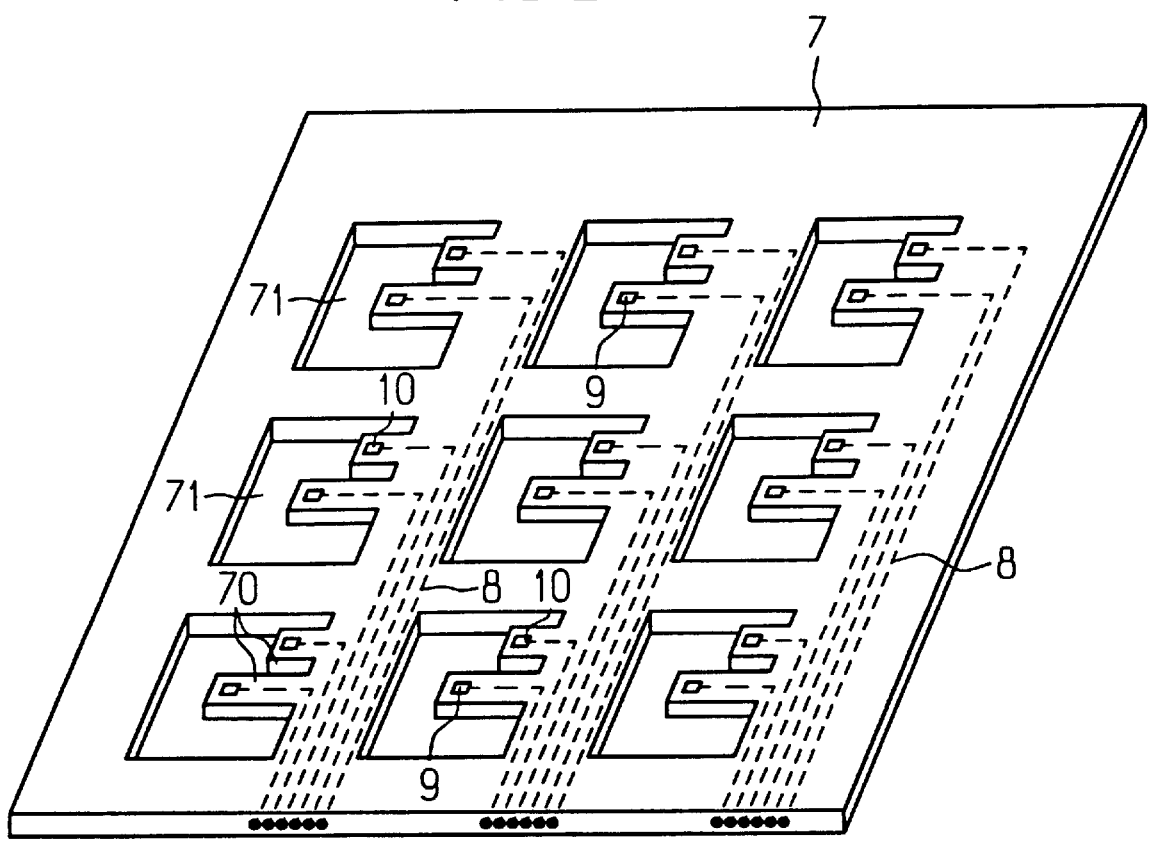
FIG. 3 illustrates an embodiment of printed circuit board or film provided with interconnects, for use in the inventive matrix converter.

FIG. 3 shows a preferably flexible printed circuit board 7 with interconnects 8. The printed circuit board can be a film of dielectric material; polyimide (for example, Kapton®) is especially suited therefor. Such a film can be produced in a suitable thickness given an adequate insulating effect. The interconnects in this film are provided for the connection of gate or, auxiliary emitters of each chip to the drive electronics. Narrow and thin interconnects on the film therefore suffice. A multi-layer structure of at least two layers of the material of the film enables good insulation of the interconnects on both sides. A plurality of layers of the film between which a respective part of the interconnects is arranged can also be present on top of one another.

The structured printed circuit board 7 shown in FIG. 3 comprises openings 71 in this exemplary embodiment into which laterally projecting parts 70—in the form of tongues or clips here—project. These tongues fit into the recesses 5 of the busbars shown in FIG. 1. The square areas shown on the parts 70 in FIG. 3 represent the terminals 9 for a gate and the terminals 10 for an auxiliary emitter that are contacted to the gate contact on the underside of the respective chip and, preferably, to a small area of the emitter contact on the underside of the chip. Since the only concern in the case of the auxiliary emitter terminals is to tap the potential as close as possible to the respective emitter contacts, the terminals 10 for the auxiliary emitters can also be attached directly to suitable contact surfaces of the power leads. The terminals 10 of the auxiliary emitters can thus also be attached to the side of the printed circuit board 7 lying opposite the gate terminals 9 when suitable contact surfaces are present in the appertaining recesses of the busbars. The illustrated embodiment of the auxiliary emitter terminals at the emitter contacts of the chips has the advantage of being simple to manufacture, since the gate terminals and the auxiliary emitter terminals can be manufactured in the same method step.

The interconnects 8 proceeding in the structured printed circuit board, for example between two layers of a film, are indicated with broken lines, said interconnects being conducted from their ends shown at the bottom to the drive electronics (not shown). The interconnects can be conducted out of the printed circuit board at an edge; the drive electronics can also be integrated in or on the printed circuit board.

The printed circuit board 7 can be fashioned surface-wide. Corresponding openings 71 or recesses in the regions of the power leads provided for the contacting are present in the film for contacting the emitter contacts attached to the chips to the power leads (busbars 4). The matrix-like arrangement is already adequately fixed due to the attachment of the chips on the gate terminals 9. In order to be able to produce an electrical contact between the emitter contacts and the busbars, it can be expedient when at least shallow recesses are present in the power leads for the regions of the printed circuit board 7 arranged over the power leads. At least a part of the thickness of the printed circuit board, however, can also be compensated by a solder layer or electrically conductive adhesive layer between the emitter contacts and the upper side of the power leads. When the overall arrangement is assembled (pressure contacts) by pressing the lower part 1 and upper part 6 together, it can be necessary to completely compensate the thickness of the printed circuit board with adequately deep recesses of the power leads in the region of the printed circuit board lying thereon or with contact surfaces on the power leads that are fashioned suitably raised in the region of the emitter contacts of the chips to be contacted.

A printed circuit board or film according to FIG. 3 that is similarly structured and provided with interconnects in the inside and/or on its upper side can be present for the gate and auxiliary emitter terminals of the chips at the upper side. This structured printed circuit board or film then fits, for example, into corresponding recesses 50 of the of the busbars 40 of the upper part 6 (FIG. 2). An essentially surface-wide film with interconnects can also be present there, this being provided with recesses in the regions provided for the connection of the emitter contacts to the upper busbars 40.

For supplying powder to the power semiconductor switches, three respective power leads aligned parallel to one another are present at the top and bottom of the matrix arrangement, the upper ones thereof being aligned at an angle, preferably at a right angle, relative to the lower ones. It is not required that the power leads be disposed under or over the chips. Instead, for example, it is possible that the chips with the emitter terminals are in fact mounted directly on the lower busbars but that the upper power leads are arranged laterally next to the chips. In this case, the emitter terminals of the chips can be electrically conductively connected, for example with bond wires, to terminal surfaces of the upper power leads provided for this purpose. The chips and the upper power leads can then be arranged approximately in one plane. The application of the gate terminals and auxiliary emitter terminals on the upper side of the chips can then be relatively simply realized with a surface-wide printed circuit board or interconnect film.

Figure 4:
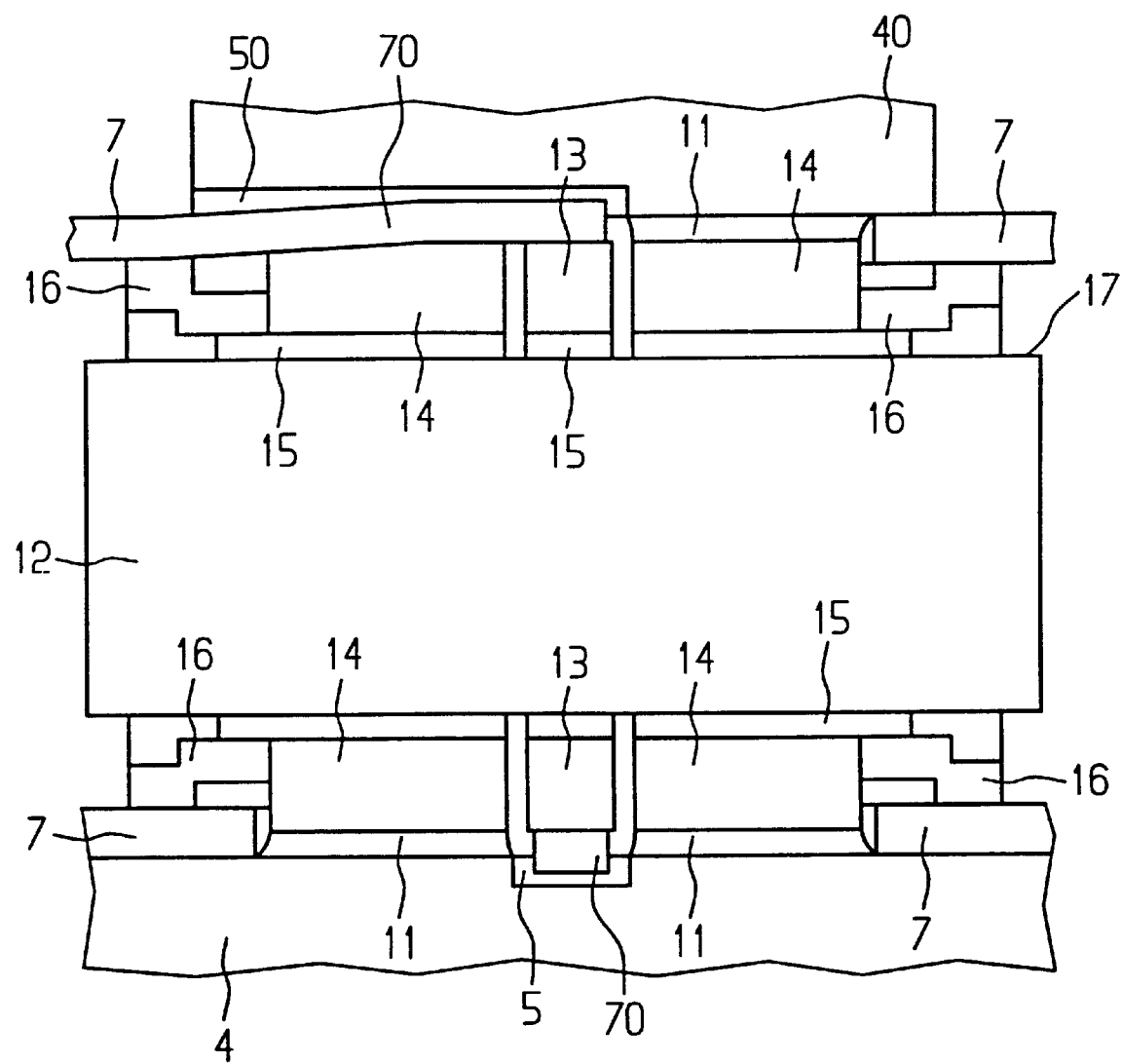
FIG. 4 illustrates a bidirectional semiconductor switch, in cross-section, for use in the inventive matrix converter.

The especially simple and compact embodiment with emitter terminals that are soldered, glued or pressed directly onto the busbars can preferably be realized with an embodiment of the chips with a respective bidirectional semiconductor switch as shown in crossection as an example in FIG. 4. The semiconductor body of the chips 12 with the doped structure functioning as IGBT, GTO or MOSFET that is fundamentally known from the initially cited publications and therefore is not shown in FIG. 4, has at least one emitter contact 14 and at least one gate contact 13 on both principal sides, the potential required for the actuation of the switch being applied thereto. The emitter contacts can be multiply present and distributed on the appertaining principal side of the chip; the gate contacts can be applied at an arbitrary location of the appertaining principal side and need not be located in the middle of the principal side.

A metallization 15 that, for example, is aluminum and is applied on the semiconductor material and provided as contact is preferably reinforced, for example by a thick layer of nickel that is typically approximately 30 $\mu$m thick. This reinforcement of the contacts of nickel can be deposited currentless onto the metallization, which is particularly expedient in the manufacture. The surface of the nickel layer can also be planarized, for example by grinding. The dielectric edge terminations of the chips have a passivation 16 on the upper side, which is preferably polyimide. The contacts 13, 14 project clearly beyond this polyimide layer and thus enable a simple electrical connection to the power leads or the gate terminals and the auxiliary emitter terminals. In the example of FIG. 4, a scriber frame is shown at the edge of the chips, this facilitating the separation of the chips during manufacture.

A good electrical insulation from the high voltages on the power leads is required at the edge of the chips. It is therefore advantageous when the printed circuit board 7 covers the edges of the chips outside the regions of the emitter contacts 14 electrically connected to the power leads. The printed circuit board is preferably glued to the edges of the chips, particularly with a passivation 16 of polyimide that is present thereat, in order to assure a better electrical insulation of the chips from the power leads. Portions of a respective printed circuit board 7 over the passivations 16 are entered over and under the chip in FIG. 4. In this example, the emitter contacts are applied on the power leads 4, 40 with conductive adhesive layers 11. The tongue-shaped portions 70 of the printed circuit boards 7 are arranged in the recesses 5, 50 of the power leads. The gate terminals are shown here. It can also be seen that the upper power lead 40 proceeds perpendicular to the plane of the drawing and that the lower power lead 4 proceeds in the plane of the drawing.

In addition to the mounting on the busbars or other power leads, or on the structured printed circuit board or film provided with the interconnects and terminals for gate and auxiliary emitter, the chips can also be fixed to one another in the matrix-shaped arrangement. This can be effected in that, for example, the lateral edges of the chips are glued into a plate provided with recesses or into a frame 18, in conformity with the cross-section shown in FIG. 5. Thin adhesive layers 19 that fix the chips are situated between the lateral surfaces (edge surfaces) of the chips 12 and the insides of the recesses of this frame.

Figure 5:
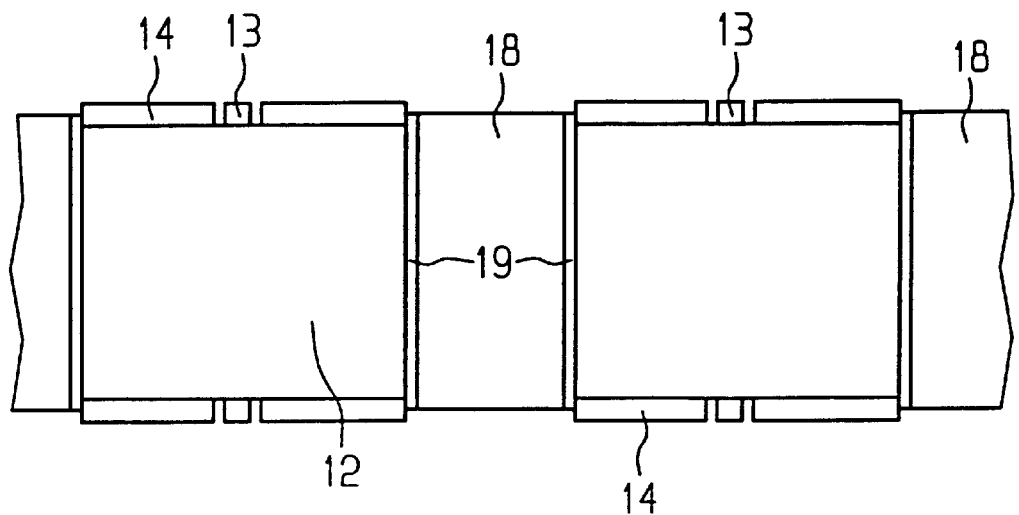
FIG. 5 is a cross-section through a matrix-like arrangement of chips in a frame, in the inventive matrix converter.
Figure 6:
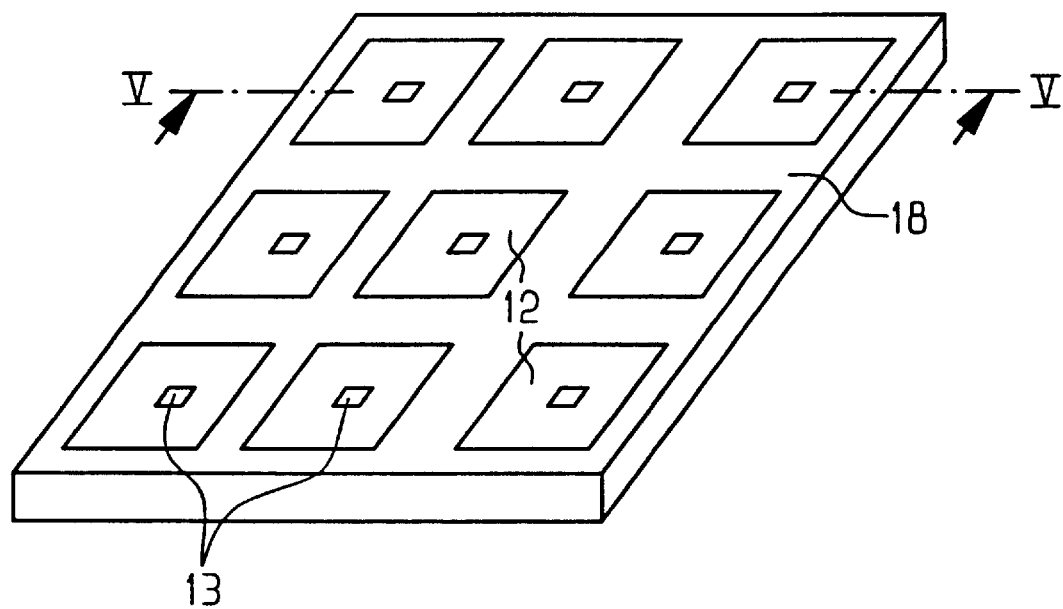
FIG. 6 is a schematic diagram of the matrix-like arrangement of the chips in a frame of FIG. 5.

FIG. 6 shows such a matrix-like arrangement of the chips 12 in a frame 18. The position of the cross-section shown in FIG. 5 is entered in FIG. 6. The small squares on the upper side of the chips represent the gate contacts 13 of the chips.

Figure 7:
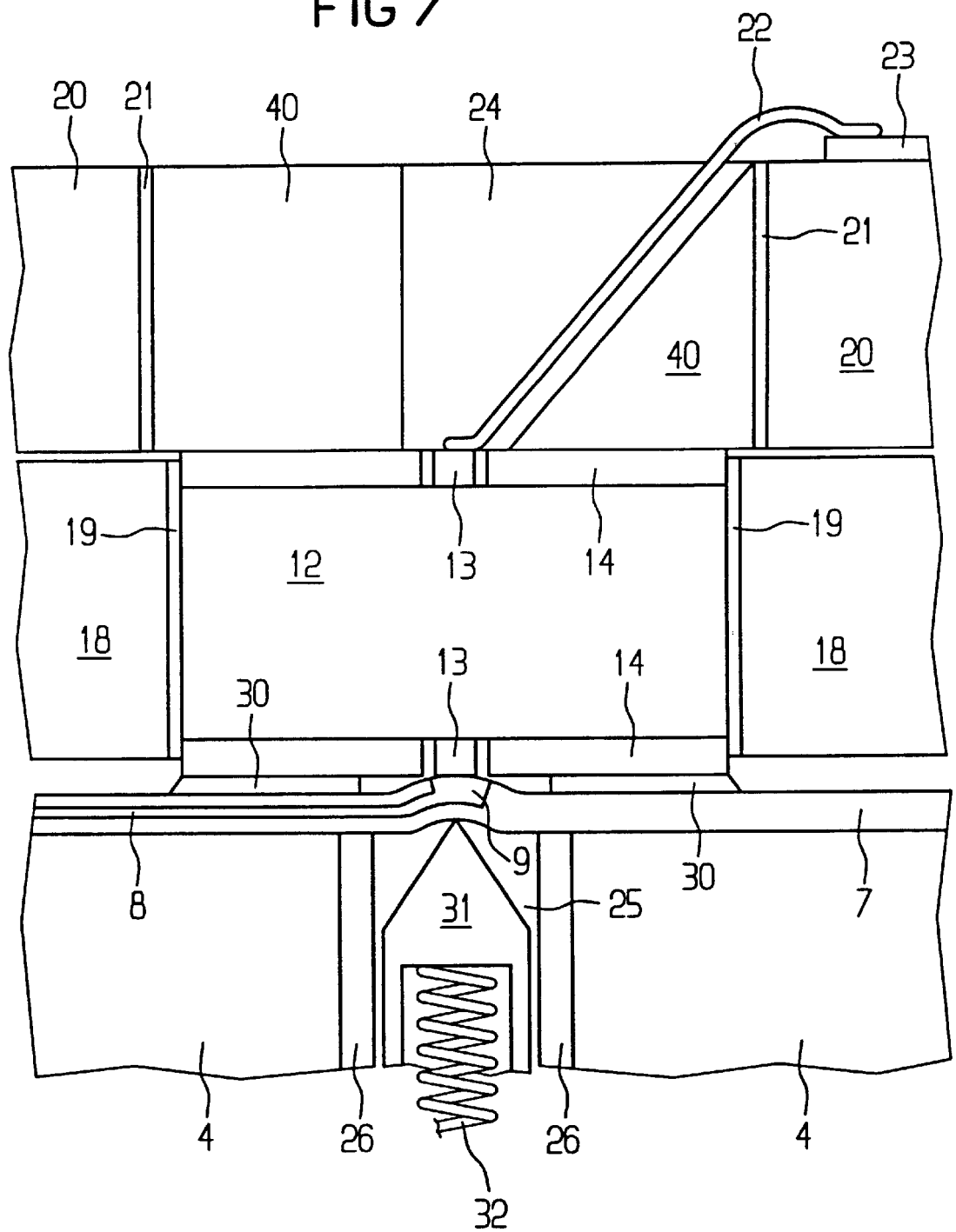
FIG. 7 is a cross-sectional view showing alternative connections for the power semiconductor components in the inventive matrix converter.

FIG. 7 shows further possibilities of the contacting of the chips. A chip 12 is shown here as an example, this being secured in a frame 18 with adhesive layers 19 in conformity with the examples of FIGS. 5 and 6. The emitter contacts 14 and the gate contacts 13 project upwardly and downwardly beyond this frame. The frame can be omitted. The upper busbar 40 for the connection of the upper emitter contacts of the chip is shown in crossection in FIG. 7 and proceeds perpendicular to the plane of the drawing. In this example, the busbar is not attached to the underside of an upper part but is secured with adhesive layers 21 in a mount 20 or a further frame. Electrically conductive terminal surfaces 23 that are connected via bond wires to a respective gate contact on the upper side of a chip are situated on the upper side of the holder. For this purpose, a suitable recess 24 that uncovers the upper side of the gate contact is respectively present in the busbar.

As a further example for the gate connection, a printed circuit board 7 as flexible interconnect film is shown at the underside of the chip. An interconnect 8 that is provided for the connection of the gate contact 13 at the underside of the chip is present in this interconnect film. Recesses in the interconnect film are present in the region in front of or behind the plane of the drawing, the busbar being connected to at least one lower emitter contact 14 of the chip therein, for example with an electrically conductive adhesive layer 30 for durable fastening of the chip on the power lead. For clarity, the interconnect film is shown disproportionately thick in FIG. 7. Given employment of a very thin interconnect film, for example of polyimide, a very thin adhesive layer 30 suffices in order to secure the emitter contacts directly on the busbar.

For illustrating how the interconnect 8 for the connection of the gate contact is arranged in the printed circuit board, the cross-section in FIG. 7 shows this interconnect from the middle terminal contact 9 applied on the gate contact of the chip parallel to the alignment of the lower busbar 4 conducted to the chip. The lower busbar 4 is aligned in the horizontal of the plane of the drawing in the illustrated crossection. In practical embodiments, the interconnect is first conducted out—perpendicular to the plane of the drawing here—in a region to the side of the busbar, bends off thereat and then proceeds parallel to the busbar.

In order to produce a dependable contact between the terminal contact 9 of the interconnect 8 and the gate contact 13 of the chip, a recess 25 is situated in the busbar, the walls thereof being preferably insulated with dielectric material and a tip 31 or the like pressed with a spring being present in the inside thereof and pressing against the printed circuit board. When the chip is arranged to the side of the busbar or when at least a lateral portion of the chip projects laterally beyond the busbar and the gate contact is applied at this location, the tip present for pressing the printed circuit board against the gate contact can also be attached laterally from the busbar in a region of the substrate that is free of the power leads. The upper side of the substrate need not be planar. The substrate can fill up the region between the busbars. Such a tip can preferably be attached in a region of the upper side of the substrate that co-planarly adjoins the upper side of the busbars, this tip pressing against the interconnect film or the flexible printed circuit board in order to contact a terminal contact 9 situated therein to a gate contact of the chip arranged laterally from the power lead.

A corresponding device can also be present at the upper side of the chip. The resiliently attached tips are then attached, for example, in the upper part that carries the upper busbars.

The possible developments and arrangements of the described components can be combined with one another according to the respective demands and can be modified with other developments of a contacting that are notoriously known from traditional assembly of unidirectional power semiconductor components.

The inventive matrix converter has the advantage of being capable of being accommodated on an extremely small space. When power semiconductor switches are employed whose chip dimensions typically amount to 13 mm×13 mm, the entire matrix converter covers an area of no more than 5 cm×5 cm. Fundamentally, however, the chips can also be manufactured smaller (for example, 5 mm×5 mm), which depends on the respective area of employment and the intensities of the currents to be processed. In addition to the compact structure, the inventive matrix converter enables a good elimination of the waste heat as a result of the direct connection of the chip underside to the highly thermally conductive power leads. Further, a good insulation of the two principal sides of the chips also succeeds due to the employment of a flexible printed circuit board or insulating film in which the gate and auxiliary emitter lines are encompassed electrically insulated.

Although modifications and changes may be suggested by those skilled in the art, it is the intention of the inventors to embody within the patent warranted hereon all changes and modifications as reasonably and properly come within the scope of their contribution to the art.

We claim:

1. A matrix converter comprising:

nine switches, each comprising a bidirectionally switchable power semiconductor component;

each of said power semiconductor components having two opposite principal sides at which respective emitter contacts are disposed, respectively serving as an input and an output for the power semiconductor component, and each of said power semiconductor components having a gate contact for applying an electrical potential for switching the power semiconductor component;

said power semiconductor components being disposed in three rows, each row containing three of said power semiconductor components, so that the respective opposite principal sides of the power semiconductor components are respectively aligned in two surfaces spaced a distance from each other;

a first set of three power leads disposed next to each other adjacent a first of said surfaces and a second set of three power leads disposed next to each other adjacent a second of said surfaces, said second set of power leads proceeding transversely relative to said first set of power leads;

each of said power semiconductor components having a first of said emitter contacts electrically connected to a power lead in said first set and a second of said emitter contacts electrically connected to a power lead in said second set; and thirty-six electrical interconnects, electrically insulated from each other and electrically insulated from said power leads, eighteen of said electrical interconnects being respectively electrically connected to said gate contacts, and another eighteen of said electrical interconnects forming auxiliary emitter terminals and being electrically connected respectively to said emitter contacts on each principal side of said power semiconductor components.

2. A matrix converter as claimed in claim 1 wherein at least a portion of said electrical interconnects are disposed in an insulated manner in a printed circuit carrier, selected from the group consisting of printed circuit boards and printed circuit films, and each interconnect having respective terminals to said gate contacts and to said emitter contacts or to points on said power leads neighboring said emitter contacts.

3. A matrix converter as claimed in claim 2 wherein said printed circuit carrier has opening therein at which said emitter contacts are connected to said power leads, and wherein said printed circuit board is attached to edges of said power semiconductor components so as to be electrically insulated from said power leads.

4. A matrix converter as claimed in claim 1 wherein said power leads comprise metallic bus bars, three of said metallic bus bars being disposed parallel to each other on a substrate to form said first set and another three of said metallic bus bars being disposed parallel to each other to form said second set, said metallic bus bars in said second set being disposed at a right angle relative to said metallic bus bars in said first set.

5. A matrix converter as claimed in claim 1 wherein said respective emitter contacts of said power semiconductor components are directly connected to said power leads, and wherein said power leads have respective recesses therein into which portions of a printed circuit carrier are inserted, said interconnects having terminals to said gate contacts disposed on said printed circuit carrier.

6. A matrix converter as claimed in claim 1 further comprising at least one polyimide film on which said interconnects are disposed.

7. A matrix converter comprising:

a three-by-three array of nine bi-directional switchable semiconductor devices, each of said nine semiconductor devices having electrode contacts on first and second opposite principal surfaces thereof;

a first circuit board having a first face facing said first principal surface, said first circuit board having nine first openings therethrough that correspond to said nine semiconductor devices, each of said nine first openings having a flexible projection therein that carries a terminal that contacts a respective one of said electrode contacts;

a first set of three parallel power leads on a second face of said first circuit board opposite said first face, each power lead in said first set of power leads contacting respective ones of said electrode contacts of three of said nine semiconductor devices through three of said nine first openings;

a second circuit board having a first face facing said second principal surface, said second circuit board having nine second openings therethrough that correspond to said nine semiconductor devices, each of said nine second openings having a flexible projection therein that carries a terminal that contacts a respective one of said electrode contacts; and a second set of three parallel power leads on a second face of said second circuit board opposite said first face of said second circuit board, said second set of power leads being transverse to said first set of power leads, each power lead in said second set of power leads contacting respective ones of said electrode contacts of three of said nine semiconductor devices through three of said nine second openings.

8. The matrix converter of claim 7, wherein said electrode contacts of said nine semiconductor devices on said first principal surface are in a first plane and said electrode contacts of said nine semiconductor devices on said second principal surface are in a second plane parallel to said first plane.

* * * * *